United States Patent
Deboy et al.

(10) Patent No.: US 6,825,514 B2
(45) Date of Patent: Nov. 30, 2004

(54) HIGH-VOLTAGE SEMICONDUCTOR COMPONENT

(75) Inventors: Gerald Deboy, München (DE); Dirk Ahlers, München (DE); Helmut Strack, München (DE); Michael Rueb, Faak a. See (AT); Hans Martin Weber, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/455,858

(22) Filed: Jun. 6, 2003

(65) Prior Publication Data

US 2003/0232477 A1 Dec. 18, 2003

Related U.S. Application Data

(62) Division of application No. 09/786,022, filed on Nov. 9, 2001, now Pat. No. 6,630,698.

(51) Int. Cl.$^7$ .............................................. H01L 29/80
(52) U.S. Cl. ..................................... 257/285; 257/287
(58) Field of Search ................................. 257/285, 287

(56) References Cited

U.S. PATENT DOCUMENTS

| | | | |
|---|---|---|---|
| 3,171,068 A | 2/1965 | Denkewalter et al. | 317/234 |
| 3,925,803 A | 12/1975 | Kobyashi | 357/22 |
| 3,961,356 A | 6/1976 | Kooi | 357/50 |
| 4,003,072 A | 1/1977 | Matsushita et al. | 357/52 |
| 4,055,884 A | 11/1977 | Jambotkar | 29/571 |
| 4,072,975 A | 2/1978 | Ishtiani | 357/23 |
| 4,101,922 A | 7/1978 | Tihanyi | 357/23 |
| 4,145,700 A | 3/1979 | Jambotkar | 357/23 |
| 4,320,410 A | 3/1982 | Nishizawa et al. | 357/43 |
| 4,345,265 A | 8/1982 | Blanchard | 357/23 |
| 4,366,495 A | 12/1982 | Goodman et al. | 357/23 |
| 4,376,286 A | 3/1983 | Lidow et al. | 357/23 |
| 4,404,575 A | 9/1983 | Nishizawa | 357/22 |

(List continued on next page.)

FOREIGN PATENT DOCUMENTS

| | | | | |
|---|---|---|---|---|
| DE | 43 09 764 A1 | 3/1993 | ......... | H01L/29/784 |
| DE | 43 09 764 C2 | 9/1994 | ........... | H01L/29/78 |
| DE | 196 04 043 A1 | 2/1996 | ........... | H01L/29/78 |
| DE | 196 04 044 A1 | 2/1997 | ........... | H01L/29/78 |
| DE | 197 30 759 C1 | 7/1997 | ........... | H01L/29/78 |
| DE | 197 36 981 C1 | 8/1997 | ........... | H01L/29/78 |

(List continued on next page.)

OTHER PUBLICATIONS

A.S. Grove: "Physics and Technology of Semiconductor Devices" p 78–83, 1967.

B. Jayant Baliga, Sorab K. Ghandi: "Analytical Solutions for the Breakdown Voltage of Abrupt Cylindrical and Spherical Junctions" (p 739–744), 1976.

Richard F. David: "Computerized Thermal Analysis of Hybrid Circuits" 27th Electronics Components Conference, May 16–18 1977 (p 324–332), 1977.

(List continued on next page.)

*Primary Examiner*—Allan R. Wilson
(74) *Attorney, Agent, or Firm*—Baker Botts L.L.P.

(57) ABSTRACT

A process for manufacturing of a semiconductor device comprising a blocking pn junction, a source zone of a first conductivity type connected to a first electrode and bordering on a zone forming the blocking pn junction of a second conductivity type complementary to the first conductivity type, and a drain zone of the first conductivity type connected to a second electrode, the side of the zone of the second conductivity type facing the drain zone forming a first surface, and in the region between the first surface and a second surface located between the first surface and the drain zone, areas of the first and second conductivity type nested in one another, comprises the step of:

varying in individual semiconductor layers, by doping, the degree of compensation in the regions of the second conductivity type.

5 Claims, 8 Drawing Sheets

U.S. PATENT DOCUMENTS

| | | | |
|---|---|---|---|
| 4,417,385 A | 11/1983 | Temple | 29/571 |
| 4,561,003 A | 12/1985 | Tihanyi et al. | 357/23.4 |
| 4,593,302 A | 6/1986 | Lidow et al. | 357/23.4 |
| 4,748,103 A | 5/1988 | Hollinger | 430/314 |
| 4,754,310 A | 6/1988 | Coe | 357/13 |
| 4,775,881 A | 10/1988 | Ploss et al. | 357/30 |
| 4,777,149 A | 10/1988 | Tanabe et al. | 437/142 |
| 4,895,810 A | 1/1990 | Meyers et al. | 431/41 |
| 4,914,058 A | 4/1990 | Blanchard | 437/203 |
| 4,926,226 A | 5/1990 | Heremans et al. | 357/27 |
| 4,941,026 A | 7/1990 | Temple | 357/23.4 |
| 4,974,059 A | 11/1990 | Kinzer | 357/23.4 |
| 4,975,782 A | 12/1990 | Bauer | 357/38 |
| 4,994,871 A | 2/1991 | Chang et al. | 357/23.4 |
| 5,008,725 A | 4/1991 | Lidow et al. | 357/23.4 |
| 5,010,025 A | 4/1991 | Solomon | 437/29 |
| 5,019,522 A | 5/1991 | Meyer et al. | 437/29 |
| 5,045,903 A | 9/1991 | Meyer et al. | 357/23.4 |
| 5,072,269 A | 12/1991 | Hieda | 357/23.6 |
| 5,089,434 A | 2/1992 | Hollinser | 437/41 |
| 5,126,807 A | 6/1992 | Baba et al. | 357/23.4 |
| 5,182,234 A | 1/1993 | Meyer | 437/233 |
| 5,216,275 A | 6/1993 | Chen | 257/493 |
| 5,231,474 A | 7/1993 | Hollinger | 257/355 |
| 5,283,201 A | 2/1994 | Tsang et al. | 437/31 |
| 5,430,315 A | 7/1995 | Rumennik | 257/331 |
| 5,438,215 A | 8/1995 | Tihyani | 257/401 |
| 5,473,180 A | 12/1995 | Ludikhuize | 257/336 |
| 5,559,353 A | 9/1996 | Risch et al. | 257/334 |
| 5,648,283 A | 7/1997 | Tsang et al. | 437/40 |
| 5,747,831 A | 5/1998 | Loose et al. | 257/77 |
| 5,801,417 A | 9/1998 | Tsang et al. | 257/333 |
| 5,883,411 A | 3/1999 | Ueda et al. | 257/331 |
| 5,973,360 A | 10/1999 | Tihanyi | 257/330 |
| 6,037,631 A | 3/2000 | Deboy et al. | 257/339 |
| 6,291,856 B1 * | 9/2001 | Miyasaka et al. | 257/335 |
| 6,667,514 B2 * | 12/2003 | Ahlers et al. | 257/336 |
| 2001/0050549 A1 | 12/2001 | Deboy et al. | 323/313 |
| 2001/0053568 A1 | 12/2001 | Deboy et al. | 438/138 |

FOREIGN PATENT DOCUMENTS

| | | | | |
|---|---|---|---|---|
| DE | 198 08 348 C1 | 2/1998 | | H01L/29/78 |
| DE | 198 23 944 A1 | 5/1998 | | H01L/29/861 |
| DE | 198 30 332 A1 | 7/1998 | | H01L/29/06 |
| DE | 198 40 032 C1 | 9/1998 | | H01L/29/78 |
| EP | 0 053 854 B1 | 6/1982 | | H01L/29/06 |
| EP | 0 069 429 A2 | 1/1983 | | H01L/29/78 |
| EP | 0 447 873 A2 | 4/1992 | | H01L/29/784 |
| EP | 0 772 244 A1 | 5/1997 | | H01L/29/78 |
| EP | 0 834 926 A3 | 8/1998 | | H01L/29/08 |
| EP | 0 939 446 A1 | 9/1999 | | H01L/29/08 |
| EP | 0 973 203 A2 | 1/2000 | | H01L/29/06 |
| GB | 2 089 118 A | 2/1982 | | H01L/29/78 |
| WO | WO 97/29518 | 8/1997 | | H01L/29/78 |
| WO | WO 97/35346 | 9/1997 | | H01L/29/78 |
| WO | WO 99/04437 | 1/1999 | | H01L/29/78 |
| WO | WO 99/23703 | 5/1999 | | H01L/29/06 |
| WO | WO99/36961 | 7/1999 | | H01L/23/48 |
| WO | WO 99/62123 | 12/1999 | | H01L/29/861 |
| WO | WO 00/02250 | 1/2000 | | H01L/29/10 |
| WO | WO 00/14807 | 3/2000 | | H01L/29/78 |

OTHER PUBLICATIONS

Vinson C. Alwin, David H. Navon, Luke J. Turgeon: "Time–Dependent Carrier Flow in a Transistor Structure Under Nonisothermal Conditions" (p 1297–1304), IEEE 1977.

Chenming Hu: "A Parametric Study of Power MOSFETS" (p 988–998), IEEE 1979.

J.A. Appel, H.M.J. Vaes: "High Voltage Thin Layer Devices (Resurf Devices)" (p 1384–1387), IEEE 1979.

Adrian Rusu, Contantin Bulucea: "Deep–Depletion Breakdown Voltage of Silicon–Dioxide/Silicon MOS Capacitors"v (p 201–205), IEEE 1979.

Chenming Hu article, "Optimum Doping Profile for Minimum Ohmic Resistance and High–Breakdwon Voltage", IEEE 1979.

IEDM Technical Digest excerpt (pp. 239, 241), 1979.

S.C. Sun, James D. Plummer: "Modeling of the On–Resistance of LDMOS, VDMOS, and VMOS Power Transistors" (p 356–357), IEEE 1980.

Tihanyi and Krauss, SIPMOS, Elektronik 1980, pp. 61–64.

Tihanyi, "A Qualitative Study of the DC performance of SIPMOS Transistors", Springer Verlag 1980.

Victor K. Temple, Robert P. Love, Peter V. Gray: "A 600–Volt MOSFET Designed for Low On–Resistance" (p 343–349), IEEE 1980.

William A. Lane, C. Andre T. Salama: "Epitaxial VVMOS Power Transistors" (p 349–355), IEEE 1980.

Takeaki Okabe, Isao Yoshida, Skikayuki Ochi: "A Complementary Pair of Planar–Power MOSFETS" (p 334–339), IEEE 1980.

G. Bell, W. Ladenhauf: "SIPMOS Techology, an Example of VLSI Precision Realized with Standard LSI for Power Transistors" (p 190–194), IEEE 1980.

Richard A. Blanchard: "Optimization of Discrete High Power MOS Transistors", UMI Dec. 1981.

J.P. Stengl, H. Strack, J. Tihanyi: "Power MOS Transistors for 1000 V Blocking Voltage" (p 422–425), IEEE 1981.

Sel Colak: "Effects of Drift Region Parameters n the same properties of Power LDMOST" (p 1455–1466), IEEE 1981.

Min–hwa Chi, Chenming Hu: "Some Issues of Power MOSFETS" (p 392–393), IEEE 1982.

Chen and Hu article, "Optimum Doping Profile of Power MOSFET Epitaxial Layer", IEEE 1982.

P.L. Hower, T.M.S. Heng, C. Huang: "Optimum Design of Power MOSFETS" (p 980–984), IEEE 1983.

Victor K. Temple: "Increased Avalanche Breakdown Voltage and Controlled Surface Electric Fields Using a Junction Termination Extension (JTE) Technique" (p 954–957), IEEE 1983.

Victor K. Temple: "Ideal FET Doping Profile" (p 619–626), IEEE 1983.

Board, Kenneth: "The Optimization of On–Resistance in Verticle DMOS Power Devices with Linear and Hexagonal Surface Geometries", IEEE 1984.

B.J. Baliga, M.S. Adler, R.P. Love et al.: "Insulated Gate Transistor: A New Three–Terminal MOS–Controlled Bipolar Power Device" (excerpt) (p 1394–1402), Jun. 1984.

Akio Nakagawa, David H. Navon: "A Time– and Temperature–Dependent 2–D Simulation of the GTO Thyristor Turn–Off Process" (p 1156–1163), IEEE 1984.

Chenming Hu, Min–Hwa Chi, Vikram M. Patel: "Optimum Designs of Power MOSFET's" (p 1693–1700), IEEE 1984.

R. Stengl, U. Gösele: "Variation of Lateral Doping—A New Concept to Avoid High Voltage Breakdown of Planar Junctions" (p 154–157), IEEE 1985.

C. Frank Wheatley Jr., Gary M. Dolny: "COMFET—The Ultimate Power Device; A General Study of Power Devices" (p 121–128), Nov. 1985.

B. Jayant Baliga: "Epitaxial Silicon Technology", Academic Press 1986.

Article from Acta Electronica Sinica, Mar. 1986, "A Novel InGaAs Phototransistor by CaO Emitter" (in Chinese) (p 35–39).

Jerry G. Fossum, Robert J. McDonald: "Charge Control Analysis of the COMFET Turn–Off Transient" (p 1377–1382), IEEE 1986.

X. B. Chen, Z.Q. Song, Z.J. Li: "Optimization of the Drift Region of Power MOSFET's with Lateral Structures and Deep Junctions" (p 2344–2350), IEEE 1987.

B. Jayant Baliga: Modern Power Devices (entire text, especially excerpt pp. 182–192, 338–339), Kreiger Publishing 1987.

Daisuke Ueda, Hiromitsu Takagi, Gota Kano: An Ultra–Low On–Resistance Power MOSFET Fabricated by Using a Fully Self–Aligned Process, IEEE Apr. 1987.

Wirojana Tantraporn, Victor A.K. Temple: "Multiple–Zone Single–Mask Junction Termination Extension—A High–Yield Near–Ideal Breakdown Voltage Technology" (p 220–2210), IEEE 1987.

H.R. Chang, R.D. Black, V.A.K. Temple, Wirojana Tantraporn, B. Jayant Baliga: IEEE Transaction, Nov. 1987; Self–Aligned UMOSFTS's with a Specific On–Resistance of 1m cm2 (pp. 2329–2334).

Chen Xingbi, Li Zhaoji, Jiang Xu: "Two–Dimensional Numerical Analysis of High–voltage Semiconductor Electric Fields", May 1988.

Zahir Parpia, C. Andre T. Salama, Robert A. Hadaway, "A CMOS–Compatible High–Voltage IC Process" (p 1687–1694), IEEE Oct. 1988.

Chen Xingbi, Li Zhaoji, Li Zhongmin:"Breakdown Voltage of Cylindrical Boundary Abrupt Junctions" (p 463–465), Chinese Journal of Semiconductors 1989.

H.R. Chang, F.W. Holroyd: "High Voltage Power MOSFET's with a Trench–Gate Structure" (pp. 381–387), Solid State Electronics 1990.

Li Zhaoji, Yu Hongquan, Chen Xingbi: "Temperature Distribution of Full Thermal Path of VDMOS" (p 435–440), Chinese Journal of Semiconductors 1990.

Article by Xing–Bi Chen presented at $2^{nd}$ German–Chinese Electronics Week Congress, Shanghai, China, 1991.

Zhang Bo, Chen Xingbi, Li Zhaoji: "Two Dimensional Electric Field Analysis of JTE Junctions" (pp. 626–632), Chinese Journal of Semiconductors 1992.

X.B. Chen et al., "Theory of a novel voltage–sustaining layer for power devices" (from Microelectronics Journal), 1998.

Deboy et al. article, "A New Generation of High Voltage MOSFETs breaks the Limit Line of Silicon" published by IEEE (2nd, color copy added, 2nd set of Bates ranges correspond).

Lorenz et al. article, "Drastic Reduction of On–Resistance with CoolMOS" in PCIM Europe, 1998.

Claus Geisler, "Birth of the Cool in MOS", May 1998.

X.B. Chen, P.A. Mawby, K. Board et. al, "Theory of a Novel Voltage–Sustaining Layer for Power Devices" (from Microelectronics Journal), 1998.

Article, "Siemens Introduces new Generation of High–Voltage MOSFET Technology", May 1998.

Article, "Siemens' new MOSFET design drastically cuts on–state resistance", May 1998.

Chen article, "Theory of a Novel Voltage Sustaining (CB) Layer for Power Devices" (from Chinese Journal of Electronics), Chinese Journal of Semiconductors Jul. 1998.

Steve Bush, "Five–fold resistance cut for high–voltage FETs", Jul. 1998.

Lorenz et al. article, "Improved MOSFET An Important Milestone Toward a New Power MOSFET Generation" featured in PCIM, 1998.

X.B. Chen et al. "High voltage sustaining structure with enbedded oppositely doped regions" , 1999.

Lai, et al.; "Characteristics and Utilization of a New Class of Low On–Resistance MOS–Gated Power Device" (1999).

Article "Power Semiconductors Proliferate" published in Electronics Products magazine re: Infineon CoolMOS products and IR CoolMOS– equivalent devices.

Xing Bi Chen & Johnny K.O. Sin "A Novel High Voltage Sustaining Structure with Buried Oppositely Doped Regions", Chinese Journal of Semiconductors Jul. 1999.

Chen article, "Optimization of the Specific On–Resistance of the CoolMOS," published by IEEE Transactions on Electron Devices, Jun. 2000.

* cited by examiner

HIGH-VOLTAGE SEMICONDUCTOR COMPONENT

CROSS REFERENCE TO RELATED APPLICATION

This application is a divisional of U.S. patent application Ser. No. 09/786,022 filed Nov. 9, 2001 now U.S. Pat. No. 6,630,698.

TECHNICAL FIELD

The present invention concerns a semiconductor device with a semiconductor body having a blocking pn-junction, a first zone of a first conductivity type, which is connected to a first electrode and abuts one of the zones of a second conductivity type opposite the first conductivity type forming the blocking pn-junction, and with a second zone of the first conductivity type, which is connected to a second electrode, whereby the side of the zone of the second conductivity type facing the second zone forms a first surface and in the region between the first surface and a second surface, which lies between the first surface and the second zone, areas of the first and of the second conductivity type are nested.

BACKGROUND OF THE INVENTION

Such semiconductor devices are also known as compensation devices. Such compensation devices are, for example, n- or p-channel MOS field effect transistors, diodes, thyristors, GTOs, or other components. In the following, however, a field effect transistor (also referred to briefly as "transistor") is assumed as an example.

There have been various theoretical investigations spread over a long period of time concerning compensation devices (cf. U.S. Pat. Nos. 4,754,310 and 5,216,275) in which, however, specifically, improvements of the on-resistance RDS(on) but not of stability under current load, such as, in particular, robustness with regard to avalanche and short circuit in the high-current operation with high source-drain voltage, are sought.

Compensation devices are based on mutual compensation of the charge of n- and p-doped areas in the drift region of the transistor. The areas are spatially arranged such that the line integral above the doping along a line running vertical to the pn-junction in each case remains below the material-specific breakdown voltage (silicon: approximately $2 \times 10^{12}$ cm$^{-2}$). For example, in a vertical transistor, as is customary in power electronics, p- and n-columns or plates, etc. may be arranged in pairs. In a lateral structure, p- and n-conductive layers may be stacked on each other laterally alternating between a groove with a p-conductive layer and a groove with an n-conductive layer (cf. U.S. Pat. No. 4,754,310).

By means of the extensive compensation of the p- and n-doping, the doping of the current-carrying region (for n-channel transistors, the n-region; for p-channel transistors, the p-region) can be significantly increased, whereby, despite the loss in current-carrying area, a clear gain in on-resistance $R_{DS}$(on) results. The blocking capability of the transistor depends substantially on the difference between the two dopings. Since, because of the reduction of the on-resistance, a doping higher by at least one order of magnitude of the current-carrying area is desirable, control of the blocking voltage requires controlled adjustment of the compensation level, which can be defined for values in the range $\leq \pm 10\%$. With a greater gain in on-resistance, the range mentioned becomes even smaller. The compensation level is then definable by (p-doping−n-doping)/n-doping or by charge difference/charge of one doping area.

Other definitions are, however, possible.

SUMMARY OF THE INVENTION

It is an object of the present invention to provide a robust semiconductor component of the kind initially mentioned, to be firstly distinguished by a high "avalanche" ruggedness and high current load capacity before and/or during breakdown and secondly simple to produce with reproducible properties in view of technological latitudes of fluctuation of manufacturing processes.

This object is accomplished according to the invention, in a semiconductor component of the kind initially mentioned, in that the regions of the first and second types of conductivity are so doped that charge carriers of the second conductivity type predominate in regions near the first surface and charge carriers of the first conductivity type in regions near the second surface.

Preferably, the regions of the second conductivity type do not extend as far as up to the second zone, so that between said second surface and the second zone, a weakly doped region of the first conductivity type remains. It is possible, however, to allow the width of this region to go to "zero." The weakly doped region, however, provides certain advantages, such as enhancement of the barrier voltage, "smooth" profile of the electrical field strength, or improvement of commutation properties of the inverse diode.

In another refinement of the invention, it is provided that between the first and second surfaces, a degree of compensation effected by the doping is so varied that atomic residues of the second conductivity type dominate near the first surface and atomic residues of the first conductivity type near the second surface. In other words, there are sequences of p, p$^-$, n$^-$, n or n, n$^-$, p$^-$, p layers between the two surfaces.

Advantageous improvements of the semiconductor device according to the invention (hereinafter also referred to as "compensation device") are disclosed by the other dependent claims.

The effect of the areas nested in each other, alternating different conductivity types, on the electrical field, is, in contrast to a conventional DMOS transistor, for example, as follows ("lateral" and "vertical" refer in the following to a vertical transistor):

(a) There is a cross-field, "lateral" to the direction of the connection between the electrodes, the strength of which depends on the proportion of the lateral charge (line integral perpendicular to the lateral pn-junction) relative to the breakdown charge. This field leads to the separation of electrons and holes and to a reduction in the current-carrying cross-section along the current paths. This fact is of primary significance for the understanding of the processes in avalanche, of the breakdown characteristic curve, and of the saturation region of the output characteristics diagram.

(b) The "vertical" electrical field parallel to the direction of the connection between the electrodes is determined locally by the difference between the adjacent dopings.

This means that with an excess of donors (n-loaded distribution: the charge in the n-conductive areas exceeds the charge of the p-areas) on the one hand, a DMOS-like field distribution (maximum of the field on the blocking pn junction, decreasing field in the direction of the opposing back of the device) appears, whereby the gradient of the field is, however, clearly less than would correspond to the doping of the n-area alone. On the other hand, however, by overcompensation of the n-conductive area with acceptors, a field distribution rising in the direction of the back is possible (p-loaded distribution: excess of acceptors compared to the donors). In such a design, the field maximum lies at the bottom of the p-area. If the two dopings are exactly compensated, there is a horizontal field distribution.

With an exact horizontal field distribution, the maximum of the breakdown voltage is obtained. If the acceptors or the donors predominate, the breakdown voltage drops in each case. If the breakdown voltage is then plotted as a function of the degree of compensation, a parabolic characteristic is obtained.

Constant doping in the p- and n-conductive areas or even a locally varying doping with periodic maxima of equal height results in a comparatively sharply pronounced maximum of the "compensation parabola". For the benefit of a "production window" (including the fluctuations of all relevant individual processes), a comparatively high breakdown voltage must be steered for in order to obtain reliable yields and production reliability. Consequently, the objective must be to make the compensation parabola as flat and as broad as possible.

When the blocking voltage is applied to the device, the drift region, i.e., the region of the areas of opposite doping arranged in pairs, is cleared of mobile charge carriers. The positively charged donor cores and the negatively charged acceptor cores remain in the spreading space charge region. They then determine the course of the field.

The flow of current through the space charge region causes a change in the electric field when the concentration of the charge carrier associated with the flow of current comes into the region of the background doping. Electrons compensate donors; holes compensate acceptors. For the stability of the device, it is also very important which doping predominates locally, where charge carriers are generated, and how their concentrations result along their current paths.

For the following embodiments, for an understanding of the basic mechanism, initially a constant doping of the p- and n-conductive areas is assumed.

In the on-state and especially in the saturation region of the output characteristics of a MOS transistor, a pure stream of electrons flows from the channel into an n-doped area, also referred to as a "column" in a vertical transistor, whereby in the base an increasing focusing of the flow of current occurs because of the electrical cross-field. High-current stability is promoted by dominance of the n-doping; however, since the channel region with its positive temperature coefficient eliminates inhomogeneous current distribution in a cell field, this mode of operation is rather uncritical. Reduction in the current density is obtained through partial shadowing of the channel connection (cf. DE 198 08 348 A1).

With regard to the breakdown characteristic or its course, the following must be taken into consideration: The generation of electrons and holes occurs in the region of maximum field strength. The separation of the two types of charge carriers is performed by the electrical cross-field. Along the two current paths in the p- and n-area, respectively, focusing and further multiplication occurs. Ultimately, also no effect of a partial channel shadowing occurs. Stability is present only when the mobile charge carriers cause a rise in the electrical field outside their source and thus a rise in the breakdown voltage of the respective cell. For compensation devices this means stability in the p- and n-loaded region, but not in the maximum of the compensation parabola. In the p-loaded region, the breakdown occurs at the "bottom" of the column. The electrons flow out of the drift region and thus do not affect the field. The holes are pulled through the longitudinal electrical field to the top source contact. In the process, the hole current is focused along its path by the electrical cross-field: The current density rises here. Thus, the longitudinal electrical field is initially affected near the surface. As a result of compensation of the excess acceptor cores (p-loaded distribution), a reduction in the gradient of the electrical field and a rise in the breakdown voltage occur. This situation is stable as long as the field there remains clearly below the critical field strength (for silicon: approximately 270 kV/cm for a charge carrier concentration of approximately $10^{15}$ cm$^{-3}$).

In the n-loaded region with an excess of donors, the breakdown is near the surface. The holes flow to the source contact and still affect the field on their path from their source to the p-well. The objective must consequently be to place the breakdown location as near as possible to the p-well. This can be accomplished, for example, by a local elevation in the n-doping. The electrons flow through the complete drift zone to the back and likewise affect the field along their current path. Stability is obtained when the effect of the electron current prevails over that of the hole current. Since the geometry of the cell arrangement plays an important role here, there is a region of stable and instable characteristic curves especially near the maximum of compensation parabola.

The conditions in the avalanche are very similar to those of a breakdown. The currents are, however, clearly higher and have with a rated current as much as twice the rated current of the transistor. Since the electrical cross-field always causes a clear focusing of the current, in compensation devices the stability range is left at comparatively low current loads. Physically, this means that the current-induced rise in the field has already advanced so much that locally the breakdown field strength has been reached. The longitudinal electrical field can then not rise further locally; the curvature of the longitudinal electrical field, however, increases which results in a drop in the breakdown voltage of the cell in question. In the characteristic curve of an individual cell and also in the simulation, this is reflected by a negative differential resistance; i.e., the voltage drops as the current rises. In a large transistor with more than 10,000 cells this results in a very rapid inhomogeneous redistribution of the current. A filament is formed, and the transistor melts locally.

This yields the following consequences for the stability of compensation devices:
  (a) Due to the separation of electrons and holes there is no "auto-stabilization" as with IGBTs and diodes. Instead, the degree of compensation, field distribution, and breakdown location must be set exactly.
  (b) On the compensation parabola, with constant doping of the p- and n-areas or "columns", there are stable regions in the clearly p- and in the clearly n-charged regions. The two regions are not contiguous. Thus, there is only an extremely small production window. With constant doping of the p- and n-areas or columns, the compensation parabola is extremely steep. The breakdown location moves within a few percent from the bottom of the p-column in the direction of the surface.

(c) For each compensation device, there is a current destruction threshold in the avalanche which is directly coupled with the degree of compensation. The degree of compensation, on the other hand, determines the achievable breakdown voltage and effects the $R_{DS}$(on) gain.

(d) With constant doping of the p- and n-areas, the devices are—as mentioned above—instable near the maximum of the compensation parabola. This results in the fact that the devices with the highest blocking voltage are destroyed in the avalanche test.

As explained above, to prevent the disadvantages, the degree of compensation is varied along the doping areas, i.e., in a vertical structure from the top in the direction of the back of the transistor, such that the atomic cores of the second conductivity type dominate near the surface and the atomic cores of the first conductivity type dominate near the back.

Figure 6:
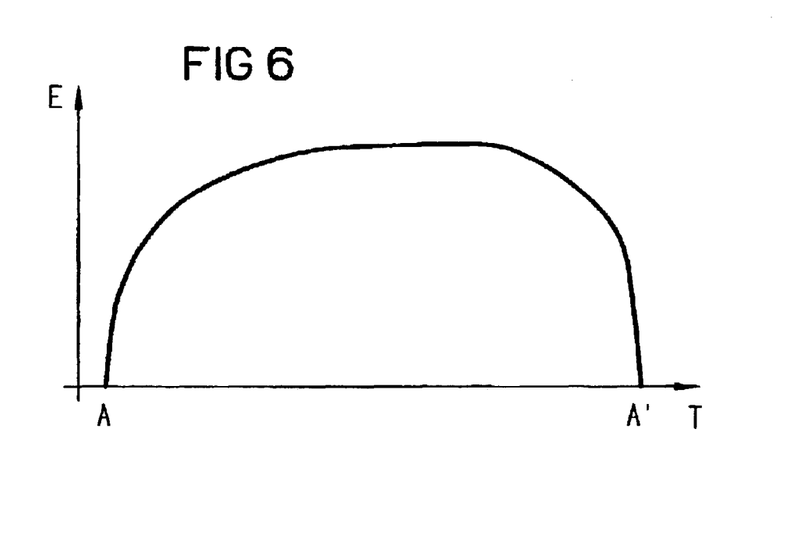

The resultant field distribution has a "hump-shaped" curve with a maximum at approximately one-half of the depth(cf. FIG. 6). Thus, both the electrons and holes affect the field distribution in the breakdown and in the avalanche. Both types of charge carriers have a stabilizing effect, since in each case they run from their source into areas in which they compensate the dominating excess background doping. There is thus a continuous stability range from p-loaded to n-loaded degrees of compensation.

A variation of the degree of compensation due to production fluctuations shifts the breakdown location only slightly in the vertical direction and continuously back and forth, as long as this variation is less than the technically adjusted variation of the degree of compensation. The size of this modification of the degree of compensation also determines the limits of the stability range. Thus, the production window becomes freely selectable.

The focusing of the currents is clearly less pronounced since both types of charge carriers travel only one-half the path in the region of the compressing electrical cross-field. Thus, the devices can be stressed with clearly higher currents in the avalanche.

Since in a variation of the degree of compensation, e.g., in the direction toward "n-loading", the electrical field increases in each case in the upper area of the drift region, but simultaneously decreases in the lower area (vice versa with variations toward p-loaded distribution), the breakdown voltage varies only relatively little as a function of the degree of compensation. Thus, the compensation parabola becomes preferably flat and wide.

The vertical variation of the degree of compensation can be effected by variation of the doping in the p-region or by variation of the doping in the n-region or by variation of the doping in both regions. The variation of the doping along the column may have a constant rise or be in a plurality of steps. In principle, the variation increases monotonically from a p-loaded degree of compensation to an n-loaded degree of compensation.

The invention can be readily applied even with p-channel transistors. In that case, an appropriately altered course of the semiconductor regions occurs: A (p, p-dominated, n-dominated, n) course is replaced by an (n, n-dominated, p-dominated, p) course.

The stability limits are reached on the n-loaded side when the field runs horizontally near the surface over an appreciable part of the drift region. On the p-loaded side the stability limits are reached when the field runs horizontally near the bottom of the compensating column region over a noticeable part of the drift region.

In general, the compensation parabola becomes flatter and wider the greater the gradient of the degree of compensation. The breakdown voltage in the maximum of the compensation parabola drops accordingly.

Another important limitation of the variation of the degree of compensation results from the requirement to remain below the breakdown charge. In addition, with greater elevation of the p-column doping near the surface, current pinch-off effects occur near the surface (lateral JFET effect).

For 600 V devices, a variation of the degree of compensation lengthwise of the p- and n-areas of 50%, for example, is advantageous.

Although above the starting point has been primarily a vertical transistor, the semiconductor device according to the invention can, in principle, have a vertical or even a lateral structure. With a lateral structure, n- and p-conductive plate-shaped areas are, for example, arranged laterally stacked in each other.

Applications for such lateral transistors are, for example, found in the smart power sector or in microelectronics; vertical transistors are, in contrast, produced primarily in power electronics.

The vertical modification of the degree of compensation is very simple to implement since in the individual epitaxial planes, only the implantation dose must be altered. The "real" compensation dose is then implanted in the middle epitaxial layer; below that, for example, 10% less in each case, above that, for example, 10% more in each case. However, instead of the implantation dose, it is possible to alter the epitaxial doping.

By means of the more manageable variation, it is possible to reduce the production costs. The number of necessary epitaxial layers can be reduced, and the openings for the compensation implantation can be reduced as a result of greater variation of the implanted dose due to the greater relative variation of the resist dimension with simultaneously prolonged subsequent diffusion for the merging of the individual p-regions into the "column".

The structure according to the invention is produced by the following individual steps:

First, a multi-$\mu$m-thick, n-doped epitaxial layer is applied to a semiconductor substrate. The p-doping ions are introduced into this epitaxial layer via a resist mask by means of ion implantation. Next, the entire process is repeated as often as necessary until there is an adequately thick n-multi epitaxial layer with embedded p-centers aligned with each other and stacked. The production of the actual device then occurs, by means of, for example, the processing of the base zones, the source zones, the front metalization, and the gate electrodes in a field effect transistor. By thermal diffusion, the p-doped centers merge into a rippled vertical column. Due to intrinsic compensation, the concentration of the p- or n-doping material is always substantially higher than the resultant electrically active doping.

The ripple of the vertical column is expressed in a varying acceptor-donor ratio $k_e(z)$ per horizontal plane. The electrical compensation varies accordingly in each horizontal plane in the semiconductor body. The ripple of the column causes no significant change in the horizontal field. Consequently, in the first approximation, the contribution $U_{Bh}$ is considered unaffected by the ripple.

In the vertical direction, layers with non-horizontally compensated p- and n-charges alternate. An epitaxial layer corresponds to a complete ripple period and, consequently, corresponds to two adjacent pn-junctions. Due to the production fluctuations in the epitaxy cycles, the charge balance is not equalized over the entire volume of a pn-junction such that the degree of compensation does not equal 0.

In a semiconductor device according to the present invention, the voltage consumed in the blocked state in the cell field between anodes and cathodes or in a field effect transistor vertically between source and drain must also be discharged laterally on the edge of the semiconductor device. Semiconductor devices are often operated up to a breakdown. In this case, a very high current flows through the impact ionization which occurs. In order not to destroy the semiconductor device, no excessively high current densities may occur, i.e., the breakdown current must be distributed as uniformly as possible over the entire semiconductor device. However, this requirement can be fulfilled only if the cell field carries the majority of this current. If the semiconductor device breaks down in the edge structure at a smaller blocking voltage than the cell field, this results in most cases in irreversible thermal damage to the semiconductor device. The semiconductor device must, consequently, be avalanche-rugged. Avalanche-rugged semiconductor devices, especially vertical transistors, reduce the safety distance necessary to manage overvoltages, whereby in many applications comparatively low-blocking transistors may be used, which require at the same $R_{DS}(on)$ a comparatively small semiconductor device surface and are thus more economical. With conventional high-voltage MOSFETs, this is very significant since the $R_{DS}(on)$ of these transistors rises disproportionately with the breakdown voltage. With conventional power devices, expensive surface-mounted structures or structures near the surface usually result in the situation that the semiconductors device edge can block more voltage than the cell field. The lower-lying semiconductor device volume is homogeneously doped so low that it withstands the necessary voltage without structuring. With the semiconductor devices according to the present invention, which use the production process of intrinsic compensation, the demands with regard to the edge structure are intensified because here even the lower-lying volumes under the edge must be processed. The material actually accommodating the blocking voltage, i.e., the epitaxial layer above the highly doped semiconductor substrate, is relatively low ohmic and will only block a fraction of the required voltage. The blocking capability for the cell field is achieved only with the introduction of the counter doped columns.

For the volume below the edge, there are, in principle, two different processing methods:

1. The semiconductor edge may be processed separately from the cell field, i.e., in additional steps. An overall counter doping of the substrate on the semiconductor edge, e.g., by means of overall edge implantation and diffusion, is conceivable. Thus, an overall intrinsically compensated and thus highly blocking edge can be produced. Such a procedure is, however, associated with very high costs.
2. The column structure in the cell field is continued into the edge, whereby the substrate is also built up to basically the same blocking voltages as in the cell field. A minimal increase, for example, in the dielectric strength of the edge may be obtained in many cases by means of a suitable variation of the deep compensation profile of the columns, as this has been described on the preceding pages for the cell field, whereby, however, the tolerance range compared to the cell field and thus the tolerance range of the entire semiconductor device becomes smaller. Additionally, additional effects may provoke breakdown on the edge of the semiconductor device.

On the one hand, the surface-mounted edge structures or structures near the surface cause additional field distortions and generate centers of high field strength.

On the other hand, it may be necessary to apply an expedient negative "error charge" to the edge, which causes a curvature of the equipotential lines toward the semiconductor device surface, whereby these can be picked up and carried by the surface structure. This corresponds to a field discharge on the semiconductor device edge. This error charge condition may also cause a voltage-induced premature breakdown of the semiconductor device edge compared to the cell field.

Accordingly, it is best to reduce the horizontal components of electric field and simultaneously the vertical ripple of the compensation profile on the edge. Both result in higher blocking voltages on the semiconductor device edge. To implement this, the local separation must be eliminated or at least weakened in the charge centers of opposing polarity, i.e., an intrinsic compensation must be undertaken.

Thus, a high-voltage resistant edge structure is created, which consists of a plurality of floating zones of the second conductivity type, which are separated by intermediate zones of the first conductivity type, whereby the width of the intermediate zones and width of the floating zones are smaller than the width of the areas of the first and of the second conductivity type, which are nested in each other inside the cell fields. These floating zones and intermediate zones are doped such that the charge carriers of floating zones and of intermediate zones are completely cleared with the application of blocking voltage.

Thus, preferably, the edge volume is processed in one and the same operation, whereby both the thickness of an individual epitaxial layer and the cell grid is reduced in size in the edge region, yielding at the end of the process homogeneous dopant distribution for both types of charge carriers for each edge cell. With regard to the ratio of unmasked surface per cell to the total cell surface in the edge region, the charge applied by implantation can be ideally adapted to the charge which is defined by the epitaxy. In order to achieve ideal blockability, a charge balance, i.e., intrinsically compensated condition, is sought.

Preferably, the thickness of the individual epitaxial layers will be designed according to specifications which the cell field defines. This again yields a vertically rippled compensation profile on the semiconductor edge, but in a substantially weaker form than in the cell field. A reduction in the cell grid results in the fact that the resolution of the doping material source is reduced, whereby the boundaries of the individual diffusion fronts become blurred.

An additional advantage of the edge design described is the coupling between the production defects in the edge and in the cell field since error mechanisms act in both regions in the same direction.

BRIEF DESCRIPTION OF THE DRAWINGS

The invention is explained in detail in the following with reference to the drawings. They depict.

DETAILED DESCRIPTION OF THE PREFERRED EMBODIMENTS

Figure 1:
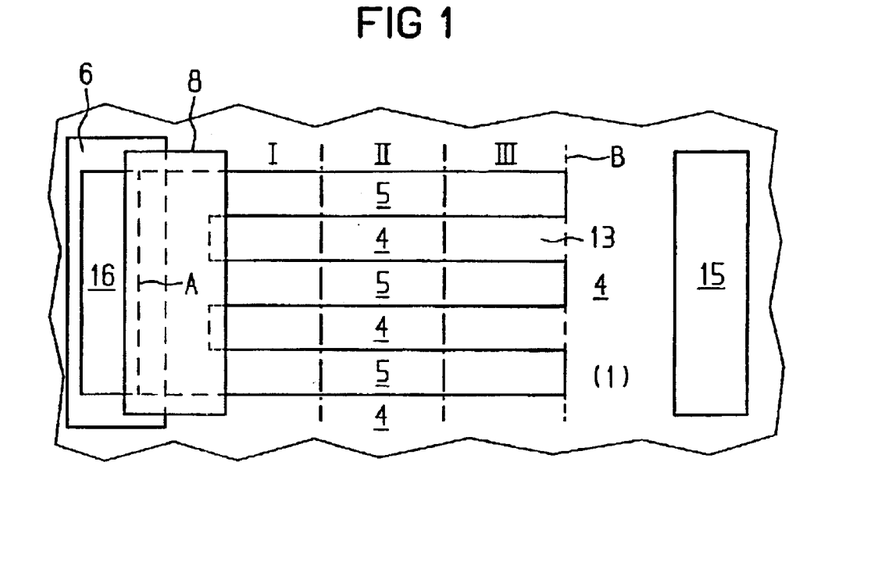
FIG. 1 a top view of an n-channel lateral MOS transistor according to a first exemplary embodiment of the invention, FIG. 2 a cross-section of an n-channel lateral MOS transistor with V-shaped grooves according to a second exemplary embodiment of the invention, FIGS. 3a through 3d various layouts in the semiconductor device according to the invention, FIG. 4 a cross-section through an n-channel lateral MOS transistor according to a third exemplary embodiment of the invention, FIG. 5 the course of the degree of compensation K along the line C-D in FIG. 4, FIG. 6 the course of the electrical field along the line C-D in FIG. 4, FIG. 7 the course of the breakdown voltage as a function of the degree of compensation for constant doping and for variable doping, FIG. 8 a concrete example of the cell design for an n-channel MOS transistor, FIGS. 9a through 9c various square edge structure layouts in the semiconductor device according to the invention, FIGS. 10a through 10c various strip edge structure layouts in the semiconductor device according to the invention, FIG. 11 a hexagonal edge structure layout in the semiconductor device according to the invention, FIG. 12 a cross-section through an n-channel MOS transistor according to a fourth exemplary embodiment with an edge structure layout, and FIG. 13 a cross-section through an n-channel MOS transistor according to a fifth exemplary embodiment with a different edge structure layout.

FIG. 1 depicts a top view of an n-channel MOS transistor with an $n^+$-conductive drain zone 15, an $n^+$-conductive source zone 16, a gate electrode 8, and a p-conductive area 5. This p-conductive area 5 extends finger-like into an n-conductive area 4 on a semiconductor substrate 1, such that the areas 4 and 5 are "nested" in each other. The gate electrode 8 may, for example, be made of polycrystalline silicon, whereas an isolation layer not shown in FIG. 1 below this gate electrode 8 is made, for example, of silicon dioxide and/or silicon nitride. In the p-conductive area 5, a p-charge excess is present in a zone I; a "neutral" charge, in a zone II; an n-charge excess, in a zone III. This means that in the area 5 in the zone I, the p-charge dominates the charge of the surrounding n-conductive area 5; that also in the zone II, the p-charge exactly compensates the charge of the surrounding n-conductive area 5; and that in the zone III, the p-charge is less than the charge of the surrounding n-conductive area 5. It is thus significant that the charge of the p-area 5 is variable whereas the charge of the n-areas 4 is in each case constant.

The p-conductive area 5 extends from the edge of the source zone 16, i.e. from a surface A to a dashed line surface B in the n-conductive region 4. This surface B is positioned at a distance from the drain zone 15, such that there is, between the surface B and the drain zone 15, an n-conductive region 13 in which there is no "nesting" with p-conductive regions 5. However, it is also possible to shift the surface B to the edge of the drain zone 15, such that there is no n-conductive region 13. Advantageously, however, the surface B is positioned at a distance from the drain electrode 15, which results in an increase of the blocking voltage, a smoother course of the electrical field, and an improvement of the commutating characteristics of the inverse diode.

Figure 2:
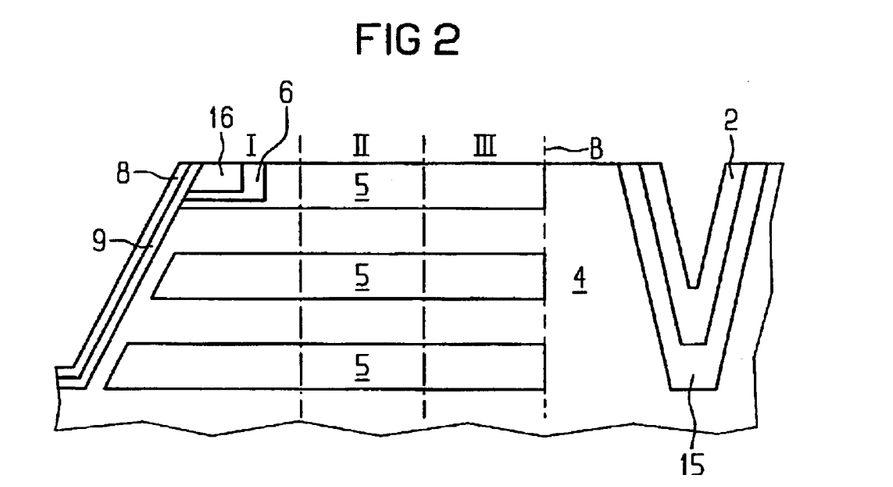

FIG. 2 depicts a cross-section through another exemplary embodiment of the semiconductor device according to the invention in the form of an n-channel MOS transistor with a drain electrode 2 and a gate insulation layer 9 between the gate electrode 8 and the channel region, which is provided under the insulation layer 9 between a source zone 16 and a drain zone 15 in a p-conductive region 5. Also, in this exemplary embodiment, the p-conductive areas 5 in the zones I, II, and III have variable doping, as was explained above with reference to FIG. 1.

The exemplary embodiments of FIGS. 1 and 2 depict two preferred design possibilities for lateral structures of the semiconductor device according to the invention. Essential in the two structures is the fact that the reported variable doping is present in the areas 5 and that these areas 5 do not reach the drain zone 15, i.e., terminate in a surface B at a distance from this drain zone 15. However, it is possible to move the surface B toward the edge of the drain zone 15. As stated above, the degree of compensation can be obtained by variation of the doping of the p-conductive areas 5 or of the n-conductive areas 4.

Figure 3A:
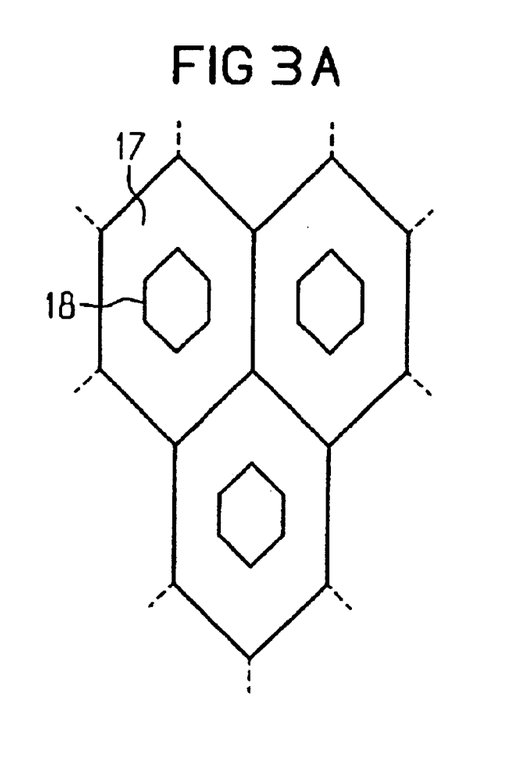
Figure 3B:
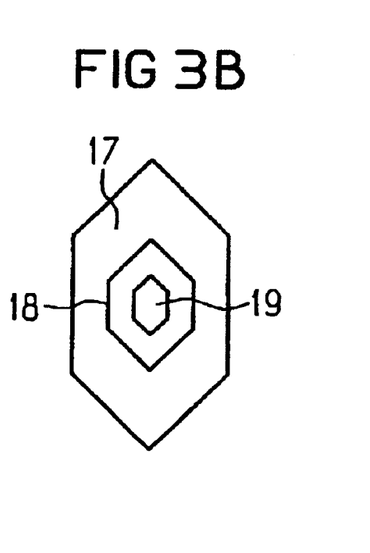
Figure 3C:
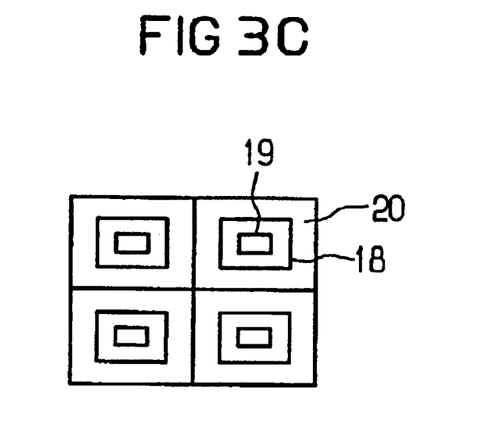
Figure 3D:
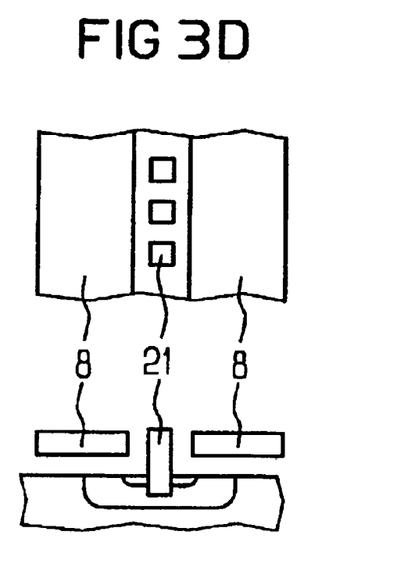

FIGS. 3a through 3d depict various layouts for the semiconductor device according to the invention with hexagonal polysilicon structures 17 and polysilicon openings 18 (FIG. 3a), in which aluminum contact holes 19 (FIG. 3b) may be provided. FIG. 3c depicts a layout with rectangular polysilicon structures 20 and corresponding polysilicon openings 18 and aluminum contact holes 19, whereas FIG. 3d schematically depicts, in a top view and in cross-section, a strip structure with polysilicon gate electrodes 8 and aluminum electrodes 21.

FIGS. 3a through 3d depict how the semiconductor device according to the invention can be designed with different structures.

Figure 4:
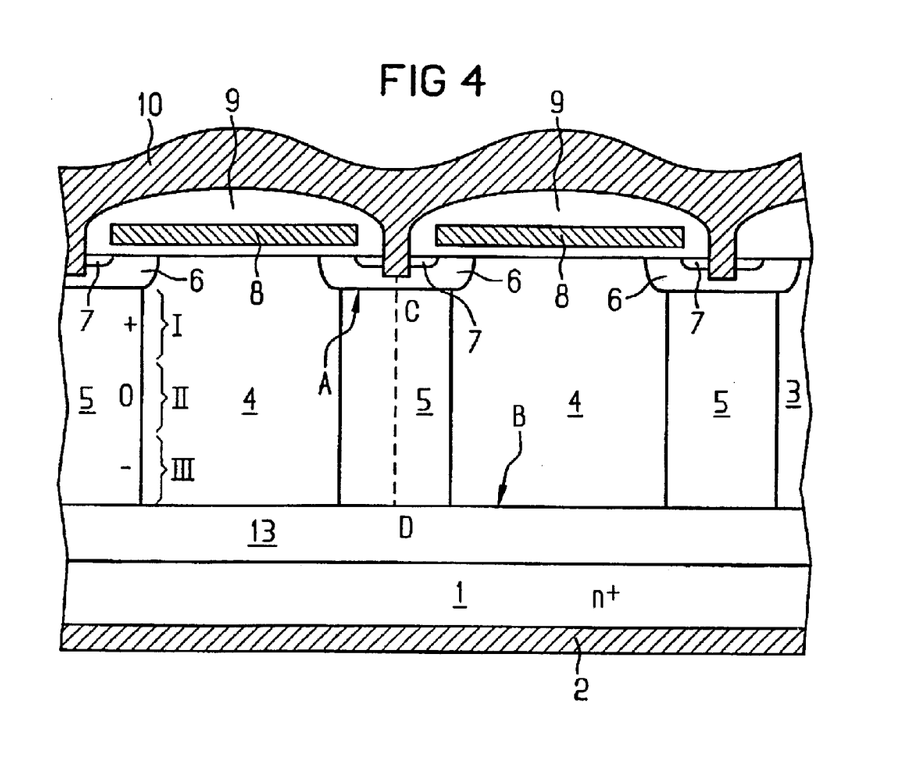

FIG. 4 depicts a cross-section through an n-channel MOS transistor with an $n^+$-conductive silicon semiconductor substrate 1, a drain electrode 2, a first n-conductive layer 13, the second layer 3 with n-conductive areas 4 and p-conductive areas 5, p-conductive zones 6, n-conductive zones 7, gate electrodes 8 made, for example, from polycrystalline silicon or metal, which are embedded in an isolating layer 9 made, for example, from silicon dioxide, and a source metalization 10 made, for example, from aluminum. Here again, the p-conductive areas 5 do not reach the $n^+$-conductive semiconductor substrate.

For the sake of clarity, FIG. 4 depicts only the metal layers hatched, although the remaining areas or zones are also depicted in cross-section.

In the p-conductive areas 5, there is a p-charge excess in a zone I, a "neutral" charge in the zone II, and an n-charge excess in zone III. This means that in the area 5 which forms a "p-column" in the zone I, the charge of the p-column dominates the charge of the surrounding n-conductive area 5, further that in the zone II, the charge of the p-column precisely compensates the charge of the surrounding n-area 5, and that in the zone III, the charge of the p-column does not yet dominate the charge of the surrounding n-area 5. It is also essential that the charge of the p-areas 5 is variable, whereas the charge of the n-areas 4 is in each case constant. However, it is possible here, as in the preceding exemplary embodiments, that the charge of the p-conductive areas 5 is constant and the charge of the n-conductive areas is varied. It is likewise possible to design the charge variable in both areas 4 and 5.

Figure 5:
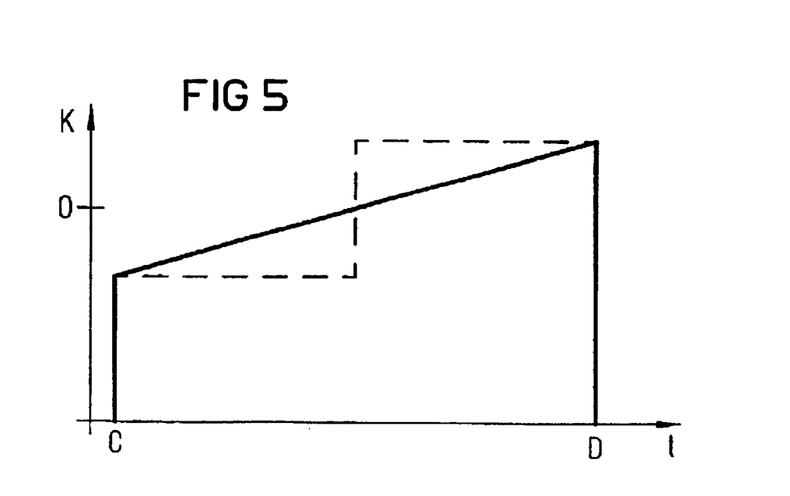

FIG. 5 depicts in a cross-section C-D the course of the degree of compensation K over the depth t of the n-channel MOS transistor: As is discernible from FIG. 5, the degree of compensation K rises monotonically with a constant gradient or in steps from the point C to point D.

It is discernible from FIG. 6 that the electrical field E has a substantially constant curvature over the area 5 between the points C and D.

Figure 7:
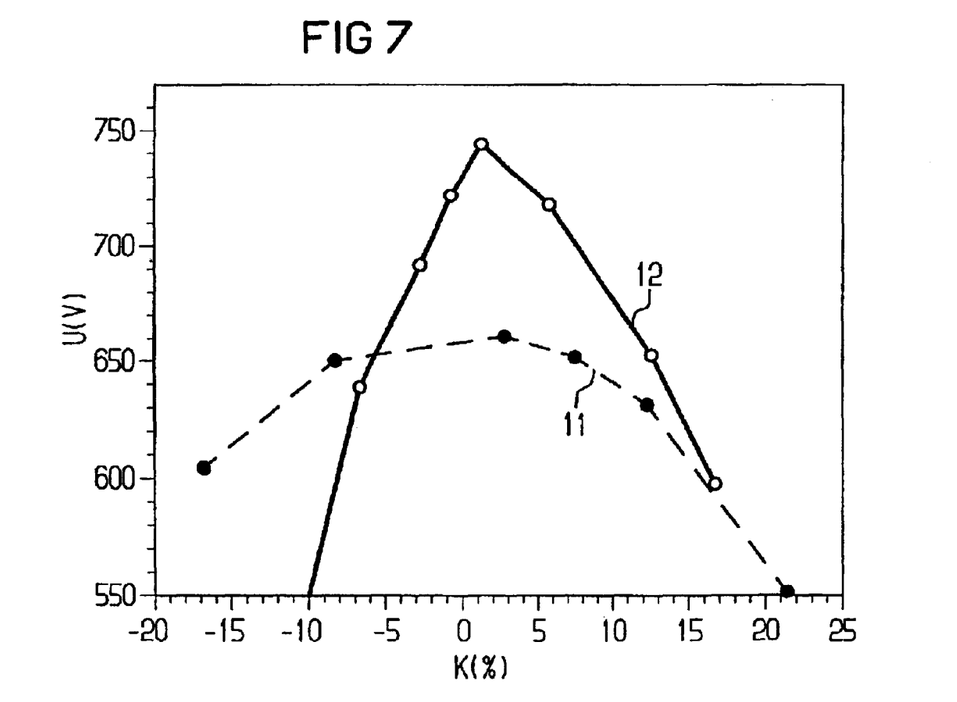

FIG. 7 depicts compensation parabolas for a constant and a variable doping of the p-conductive areas 5 in the exemplary embodiment of FIG. 4. The degree of compensation K is plotted in percentages on the abscissa, whereas the ordinate indicates the breakdown voltage U in volts. One curve 11 depicts the breakdown voltage U for a variable doping, whereas a curve 12 depicts the breakdown voltage for a constant doping. It is clear that the variable doping brings a considerable drop in the breakdown voltage from approximately 750 V to approximately 660 V. However, in exchange, a larger range of the degree of compensation can be used.

Figure 8:
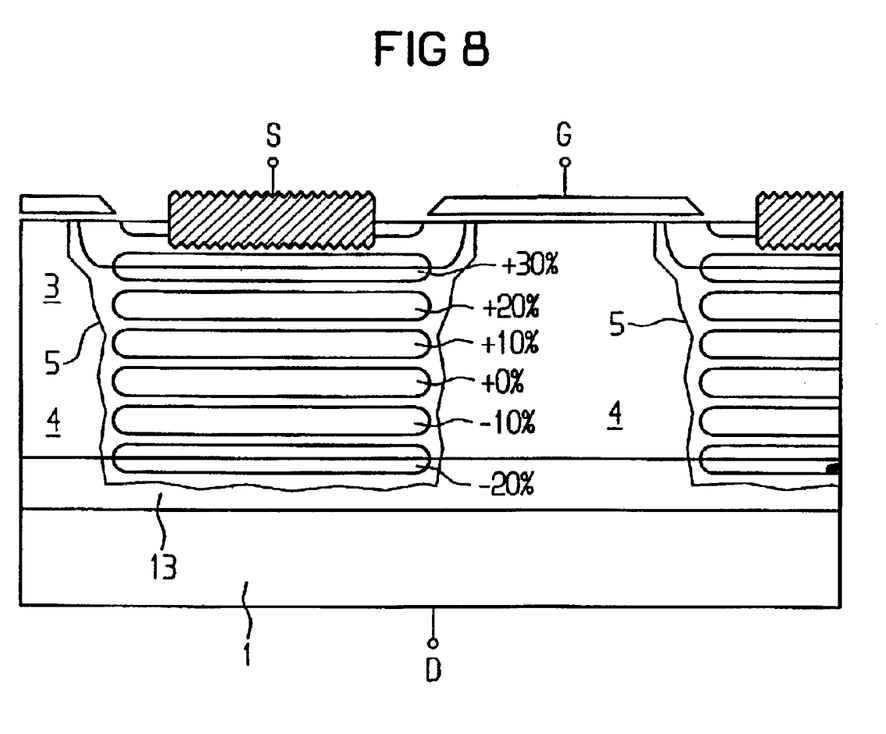

FIG. 8 depicts finally a cell design in a cross-section with a drain D, a source S, and a gate G, the $n^+$-conductive semiconductor substrate 1, an n-conductive semiconductor region 13, the n-conductive layer 3, and n-conductive regions 4 as well as p-conductive regions 5 for the p-conductive region 5 under the source electrode S. In FIG. 8 the degrees of compensation, for example, between +30% and −20% are reported, whereby a degree of compensation "0" indicates true compensation between n-doping and p-doping. Here, the doping thus varies within the "p-column" by a factor 3 whereas the doping in the "n-columns" is constant.

Figure 9A:
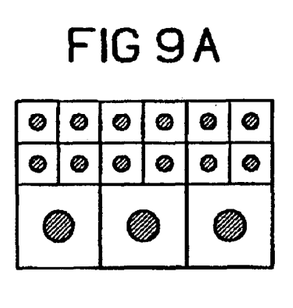
Figure 9B:
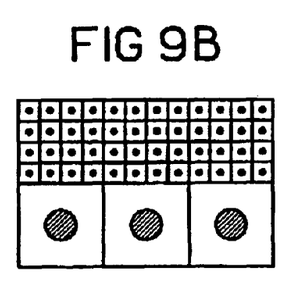
Figure 9C:
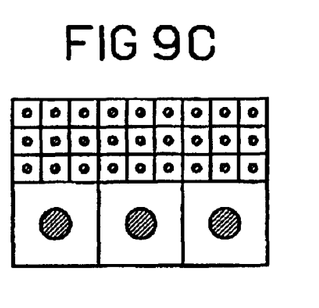

FIGS. 9a through 9c depict, in principle, as in FIG. 3a through 3d, how the semiconductor device according to the invention can be designed with different structures which extend into the edge region. As can be discerned in FIGS. 9a through c, FIGS. 10a through c and in FIG. 11, in the semiconductor edge region, a large number of floating zones 5', are formed from the second conductivity type and are separated from intermediate zones 4' of the first conductivity type. The width of the intermediate zones 4' and the widths of the floating zones 5' are smaller than the widths of the regions 4, 5 inside the cell field. The floating zones 5' and the intermediate zones 4' are dimensioned such that their charge carriers are completely cleared with the application of blocking voltage. The zones 5', which are designed lightly p-doped in the present exemplary embodiment, are "floating", i.e., they have an undefined potential. The floating zones 5' are positioned at a distance from each other, whereby the region between the floating zones 5' defines an intermediate zone 4'. This intermediate zone 4' typically has the same doping concentration as the doping in the zones 4 within the cell field.

Figure 10A:
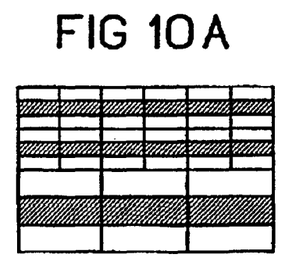
Figure 10B:
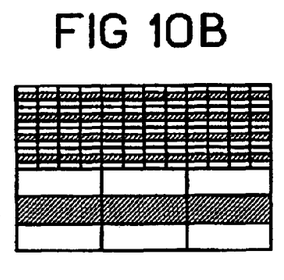
Figure 10C:
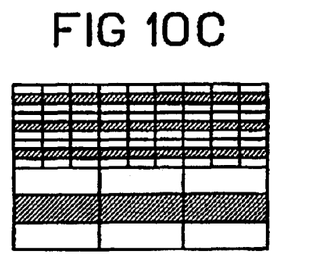
Figure 11:
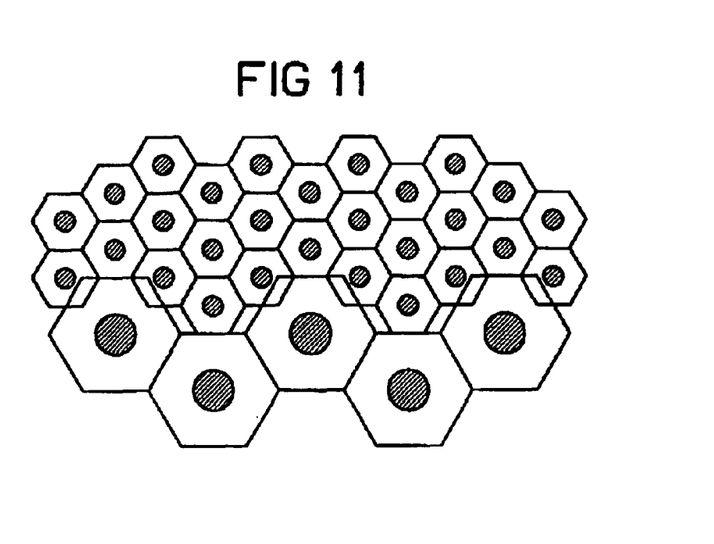

FIGS. 9a, b, and c depict different variations of the widths of the floating zones compared to the basic widths in the cell field. FIGS. 10a, b, and c depict the same thing with the strip edge structure layout and FIG. 11 with a hexagonal edge structure layout.

Figure 12:
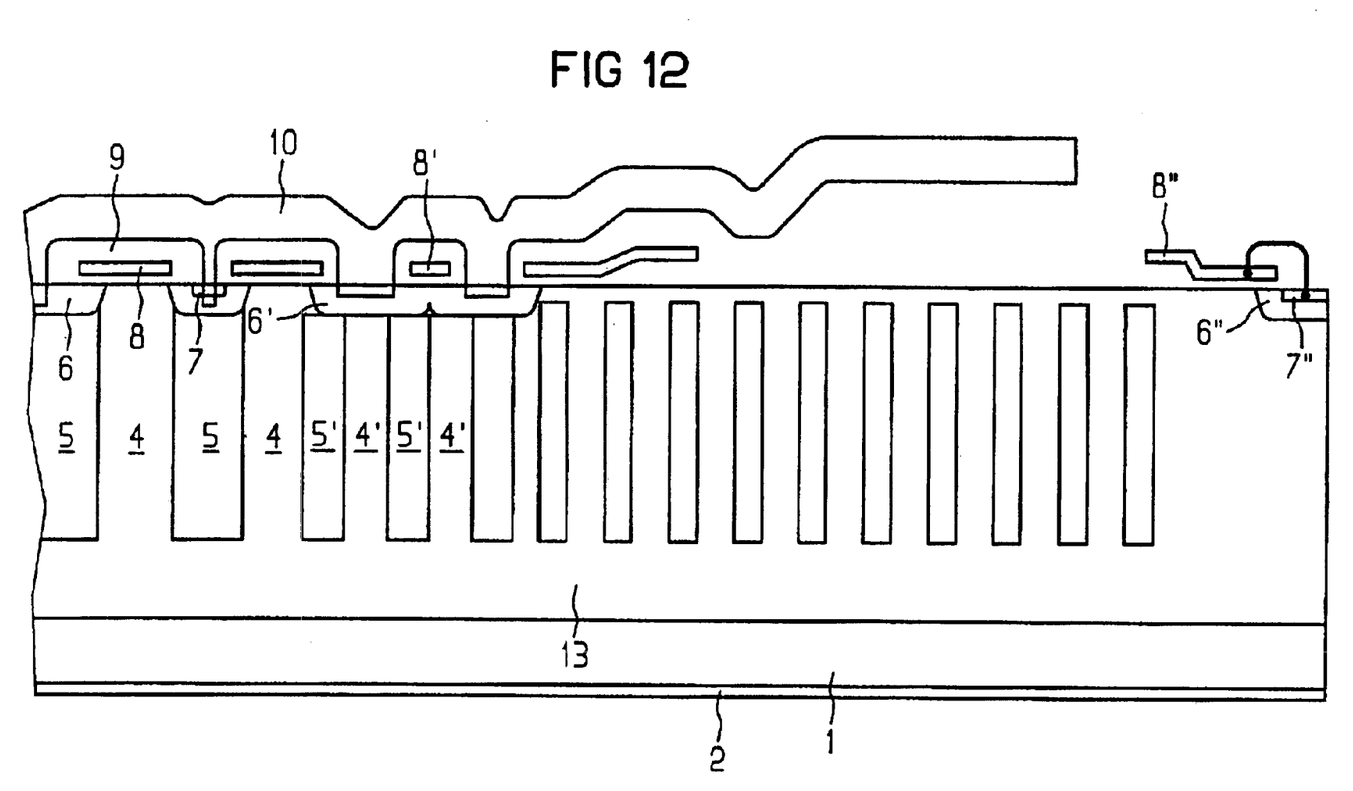
Figure 13:
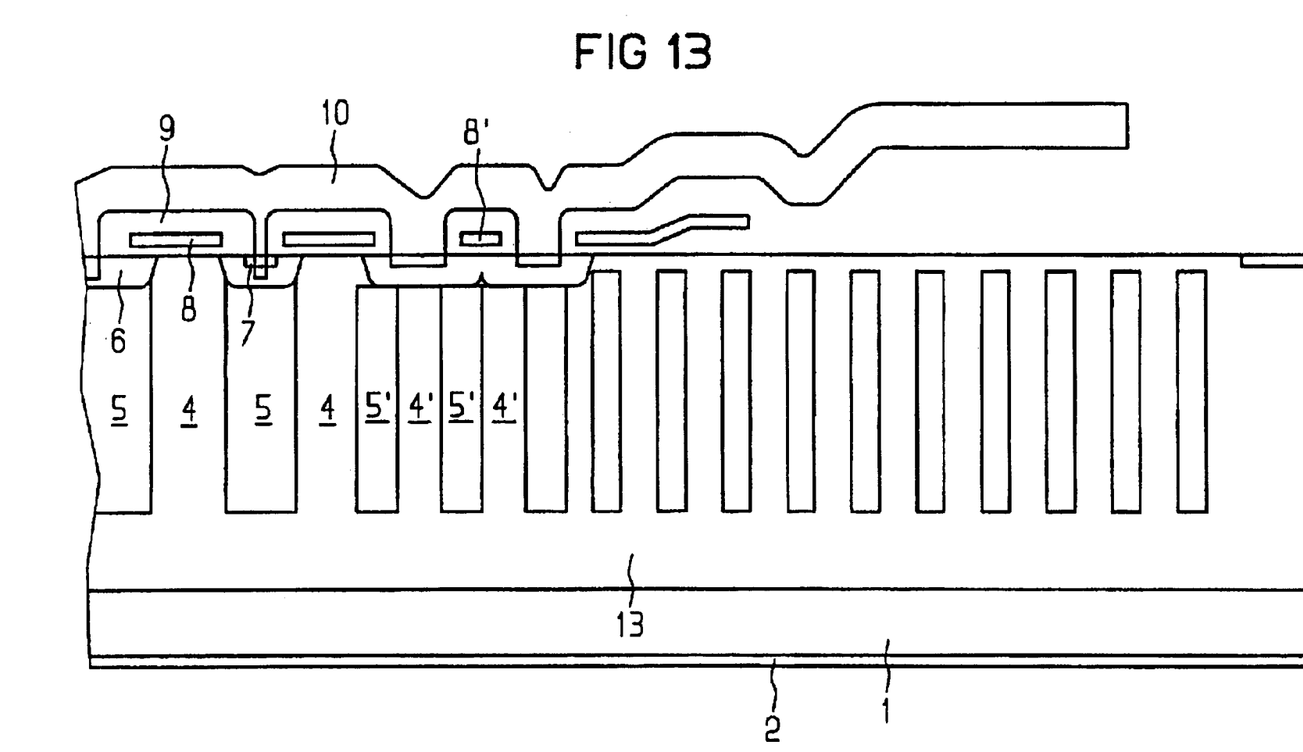

FIG. 12 and FIG. 13 depict the n-channel MOS transistor known from FIG. 4, which has been expanded by an intrinsically compensated edge termination. The transistor is built in known fashion with an $n^+$-conductive silicon semiconductor substrate 1, a drain electrode 2, a first n-conducting layer 13, a second layer with n-conducting areas 4 and p-conductive areas 5, p-conductive zones 6, n-conductive zones 7, gate electrodes 8 made, for example, from polycrystalline silicon or metal, which are embedded in an insulation layer 9 made, for example, from silicon dioxide, and a source metalization 10 made, for example, of aluminum. In the present figures in each case two p-conductive areas 5 and n-conductive areas 4 are depicted on the left side. Toward the right, additional p-conductive areas 5' and n-conductive areas 4' extend alternatingly. The p-conductive areas 5' have, compared to the p-conductive areas 5, roughly half the width; however, they extend roughly as far into the n-conductive region 13 in the direction of the substrate 1. The regions 5', 4' lying adjacent the regions 4, 5 are connected to a p-conductive zone 6', which connects via a contact hole with the source metalization 10. The p-conductive zone 6' forms a p-ring known from the prior art. The p-conductive zones 6' has, in contrast to the cell field, no n-conductive zone, to prevent parasitic transistors. The n- and p-conductive areas 4', 5' extend far beyond the p-conductive zone 6' in the direction of the edge of the device. On the outermost edge, there is a so-called channel stopper configuration, which consists of a gate electrode 8', which is electrically connected with an n-conductive zone 7'', which for its part is accommodated in a p-conductive zone 6'' in the n-conductive region 13.

The so-called space charge region stopper depicted in FIG. 13 constitutes an alternative to the channel stopper configuration depicted in FIG. 12. This space charge region stopper consists only of a well conductive $n^+$-conductive zone, which is placed in the n-conductive region.

Common to both exemplary embodiments is the fact that the contact holes of the p-conductive zone 6' are substantially larger compared to the contact holes in the n- or p-conductive zones 7, 6. The result of this is that the gate electrode 8', which lies above the areas 4', 5' is designed substantially smaller compared to the gate electrodes 8 of the cell field. The grid, in which the areas 4', 5' are arranged, is roughly half as large as the areas 4, 5 of the cell field.

What is claimed is:

1. Process for manufacturing of a semiconductor device comprising a blocking pn junction, a source zone of a first conductivity type connected to a first electrode and bordering on a zone forming the blocking pn junction of a second conductivity type complementary to the first conductivity type, and a drain zone of the first conductivity type connected to a second electrode, the side of the zone of the second conductivity type facing the drain zone forming a first surface, and in the region between the first surface and a second surface located between the first surface and the drain zone, areas of the first and second conductivity type nested in one another, comprising the step of:

varying in individual semiconductor layers, by doping, the degree of compensation in the areas of the second conductivity type.

2. Process according to claim 1, further comprising the step of:

varying in individual semiconductor layers, by doping, the degree of compensation in the areas of the first conductivity type.

3. Process for manufacturing of a semiconductor device comprising a blocking pn junction, a source zone of a first conductivity type connected to a first electrode and bordering on a zone forming the blocking pn junction of a second conductivity type complementary to the first conductivity type, and a drain zone of the first conductivity type connected to a second electrode, the side of the zone of the second conductivity type facing the drain zone forming a first surface, and in the region between the first surface and a second surface located between the first surface and the drain zone, areas of the first and second conductivity type nested in one another, comprising the step of:

varying in individual semiconductor layers, by doping, the degree of compensation in the areas of the first conductivity type.

4. Process according to claim 3, further comprising the step of:

varying in individual semiconductor layers, by doping, the degree of compensation in the areas of the second conductivity type.

5. Process for manufacturing of a semiconductor device comprising a blocking pn junction, a source zone of a first conductivity type connected to a first electrode and bordering on a zone forming the blocking pn junction of a second conductivity type complementary to the first conductivity type, and a drain zone of the first conductivity type connected to a second electrode, the side of the zone of the second conductivity type facing the drain zone forming a first surface, and in the region between the first surface and a second surface located between the first surface and the drain zone, areas of the first and second conductivity type nested in one another, comprising the step of:

varying in individual semiconductor layers, by doping, the degree of compensation in the areas of the first conductivity type, and varying in individual semiconductor layers, by doping, the degree of compensation in the areas of the second conductivity type.

* * * * *